(12) United States Patent
Park et al.

(10) Patent No.: US 9,410,264 B2
(45) Date of Patent: Aug. 9, 2016

(54) INGOT GROWING APPARATUS

(71) Applicant: S-TECH CO., LTD., Daegu (KR)

(72) Inventors: Jin Sub Park, Daegu (KR); Jin No Kim, Gyeongsangbuk-do (KR); Hyuck Cheol Kwon, Daegu (KR)

(73) Assignee: S-TECH CO., LTD. (KR)

( * ) Notice: Subject to any disclaimer, the term of this patent is extended or adjusted under 35 U.S.C. 154(b) by 0 days.

(21) Appl. No.: 14/897,559

(22) PCT Filed: Apr. 30, 2015

(86) PCT No.: PCT/KR2015/004391
§ 371 (c)(1),
(2) Date: Dec. 10, 2015

(87) PCT Pub. No.: WO2015/174665
PCT Pub. Date: Nov. 19, 2015

(65) Prior Publication Data
US 2016/0122898 A1    May 5, 2016

(30) Foreign Application Priority Data

May 14, 2014    (KR) .................. 10-2014-0057994

(51) Int. Cl.
*C30B 15/20* (2006.01)
*C30B 15/30* (2006.01)
*C30B 29/06* (2006.01)

(52) U.S. Cl.
CPC ............. *C30B 15/20* (2013.01); *C30B 15/30* (2013.01); *C30B 29/06* (2013.01)

(58) Field of Classification Search
CPC ........ C30B 15/00; C30B 15/20; C30B 15/30; C30B 35/00; C30B 35/005; Y10T 117/00; Y10T 117/10; Y10T 117/1004; Y10T 117/1008; Y10T 117/1024; Y10T 117/1032; Y10T 117/1056; Y10T 117/1072
USPC .................. 117/200–202, 206, 208, 214, 218
See application file for complete search history.

(56) References Cited

U.S. PATENT DOCUMENTS

2007/0193500 A1* 8/2007 Inagaki .................. C30B 15/20
117/11

FOREIGN PATENT DOCUMENTS

| JP | 06-234593 | * | 8/1994 |
| JP | 06234593 | A | 8/1994 |
| KR | 1020010082689 | A | 8/2001 |
| KR | 101155413 | B1 | 6/2011 |
| KR | 101153979 | B1 | 6/2012 |
| KR | 101159270 | B1 | 6/2012 |

* cited by examiner

*Primary Examiner* — Kenneth A Bratland, Jr.
(74) *Attorney, Agent, or Firm* — Levenfeld Pearlstein, LLC

(57) ABSTRACT

An ingot growing apparatus. A main chamber includes a crucible accommodating a source material therein and a heater melting the source material by heating the crucible. A dome chamber is disposed on top of the crucible. A pull chamber is disposed on top of the dome chamber. An ingot grown in the crucible moves via a seed cable within the dome chamber and the pull chamber. A weight-measuring unit is disposed on top of the pull chamber. The weight-measuring unit includes a housing disposed on top of the pull chamber, with the interior thereof being maintained in a vacuum state, a support roller disposed within the housing to support the seed cable, and a load cell disposed outside of the housing to measure a weight of the ingot supported by the support roller.

7 Claims, 3 Drawing Sheets

INGOT GROWING APPARATUS

CROSS-REFERENCE TO RELATED APPLICATIONS

This is a National Stage Application of International Patent Application No. PCT/KR2015/004391, filed Apr. 30, 2015, which claims the benefit of and priority to Korean Patent Application No. 10-2014-0057994, filed May 14, 2014, the contents of which are incorporated fully by reference herein.

TECHNICAL FIELD

The present invention relates to an ingot growing apparatus.

BACKGROUND ART

In general, a single crystal ingot is grown using the Czochralski (CZ) crystal growth method. More particularly, the CZ crystal growth method includes loading a solid material, such as polycrystalline silicon, into a crucible disposed in a hot zone area, forming a melt by heating and melting the solid material using an electric heater, dipping a single crystal seed into the melt by holding the seed using a seed holder, and slowly raising the seed while rotating the seed. The seed holder raises a single crystal ingot in the sequence of a neck part, a shoulder part having an increasing diameter, and a body part having a constant diameter. Finally, the single crystal ingot is terminated at a tail part having a decreasing diameter.

An ingot growing apparatus for growing a single crystal ingot in the above-described method includes: a main chamber having a cooling means; a quartz crucible disposed within the main chamber to melt polycrystalline silicon (into a hot melt); a graphite crucible supporting the quartz crucible; a pedestal supporting the quartz crucible and the graphite crucible; an electric heater heating the crucibles; a power supply means for supplying a large amount of power to the electric heater; a driving shaft and a driving means for supporting, rotating, raising, and lowering the crucibles and the pedestal; a dome chamber disposed on top of the main chamber; a gate valve and a viewing port disposed on the dome chamber; a pull chamber disposed on top of the dome chamber; and an ingot-raising cable and an ingot-raising means (seed mechanism) disposed in the pull chamber.

The ingot growing apparatus may further include a vacuum means for maintaining the interior of the pull chamber, the dome chamber, and the main chamber in a vacuum state; a cooling means for cooling the ingot; a plurality of detecting means for detecting states required for the growth of an ingot; a control means for controlling the plurality of detecting means; a measuring means; and the like.

However, the ingot growing apparatus of the related art has neither a function of nor a means for measuring the weight of an ingot. Thus, the length of a growing ingot is measured as a method of calculating the weight of the growing ingot and the weight of the remaining melt during a process of ingot growth. When the length of the ingot reaches a set value or when the weight of the ingot and the weight of the remaining melt reach set values, the process must be stopped for measurement. When the process is stopped in this manner, a large amount of expensive melt may remain. Although the remaining melt can be re-melted and reused, the quality of the reused melt is significantly lowered, which is problematic.

DISCLOSURE

Technical Problem

An embodiment of the present invention provides an ingot growing apparatus able to easily and accurately measure the weight of a growing ingot.

An embodiment of the present invention provides an ingot growing apparatus able to easily and accurately measure the weight of a remaining melt.

Technical Solution

According to an aspect of the present invention, an ingot growing apparatus includes: a main chamber including a crucible accommodating a source material therein and a heater melting the source material by heating the crucible; a dome chamber disposed on top of the crucible; a pull chamber disposed on top of the dome chamber; a seed cable by which an ingot grown in the crucible moves within the dome chamber and the pull chamber; and a weight-measuring unit disposed on top of the pull chamber. The weight-measuring unit includes: a housing disposed on top of the pull chamber, wherein an interior of the housing is maintained in a vacuum state; a support roller disposed within the housing to support the seed cable; and a load cell disposed outside of the housing to measure a weight of the ingot supported by the support roller.

In the ingot growing apparatus, the housing may have an opening formed in a portion thereof. The ingot growing apparatus may further include: a support roller holder positioned within and adjacent to the opening to hold the support roller; a flexible member providing a seal between the support roller holder and the opening such that an interior of the housing is maintained in a vacuum state; and a load cell holder disposed outside of the housing. The load cell held by the load cell holder supports the support roller holder.

In the ingot growing apparatus, the opening may be disposed in an upper surface of the housing.

In the ingot growing apparatus, an upper portion of the support roller holder may protrude outside of the housing through the opening.

In the ingot growing apparatus, the support roller holder may include a first holder section supporting the support roller, the first holder section extending through the opening, and a second holder section protruding outwardly from one end of the first holder section, a surface of the second holder section facing an outer circumferential surface of the opening. The flexible member may be implemented as a bellow disposed between the surface of the second support holder facing the outer circumferential surface of the opening and the outer circumferential surface of the opening.

In the ingot growing apparatus, the load cell holder may include a fixing plate to which the load cell is fixed and a plurality of support legs supporting the fixing plate such that the fixing plate is spaced apart from the upper surface of the housing.

The ingot growing apparatus may further include a load cell-adjusting part disposed on the load cell holder to adjust a position of the load cell. The load cell-adjusting part includes: first adjustment bolts disposed on side portions of the fixing plate to adjust a lateral position of the load cell; and second adjustment bolts disposed on the plurality of support legs to adjust a height of the fixing plate.

The ingot growing apparatus may further include a support roller-adjusting part for adjusting a height of the support roller, at least a portion of the support roller-adjusting part being disposed on top of the load cell. The support roller-adjusting part includes: a third adjustment bolt extending through a fixing hole formed in a central portion of the fixing plate and connecting the load cell to the second holder section, wherein the third adjustment bolt adjusts a height of the support roller connected to the second holder section; and an adjustment nut connected to one end of the third adjustment bolt and disposed on the second holder section to fix the load cell to the second holder section.

The ingot growing apparatus may further include a driving unit moving the seed cable supported by the support roller. The driving unit includes: a drum on which one end of the seed cable is wound; a driving motor driving the drum; and a speed reducer disposed between the drum and the driving motor.

Advantageous Effects

According to an embodiment of the present invention, the ingot growing apparatus can easily and accurately measure the weight of a growing ingot using the load cell and the support roller, thereby increasing the efficiency of the ingot growing process.

According to an embodiment of the present invention, the ingot growing apparatus can improve the precision of measurement and easily adjust a track, since the load cell is disposed outside of the housing, which is in a vacuum state.

BEST MODE

Figure 1:
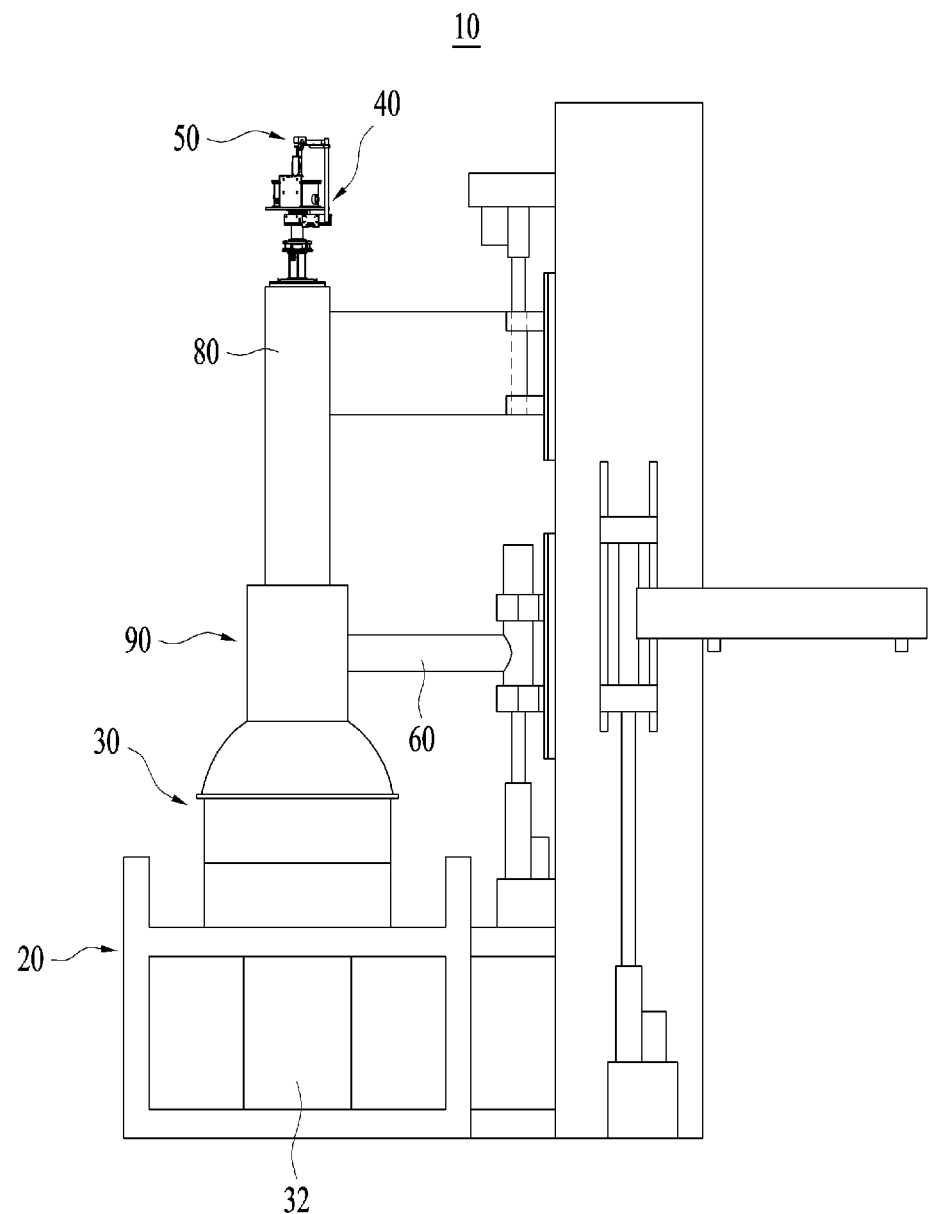
FIG. 1 is a side elevation view illustrating an ingot growing apparatus according to an exemplary embodiment of the invention.

Reference will now be made in detail to embodiments according to the present disclosure in conjunction with the accompanying drawings and described below, so that a person skilled in the art to which the present disclosure relates could easily practice the embodiments of the present disclosure. The present invention can be embodied in a variety of different forms and is by no means limited to embodiments described hereinafter. In the following description, descriptions of components irrelevant to the present disclosure will be omitted for the sake of clarity. Throughout this document, the same reference numerals and symbols will be used throughout the different drawings to designate the same or like components.

Figure 2:
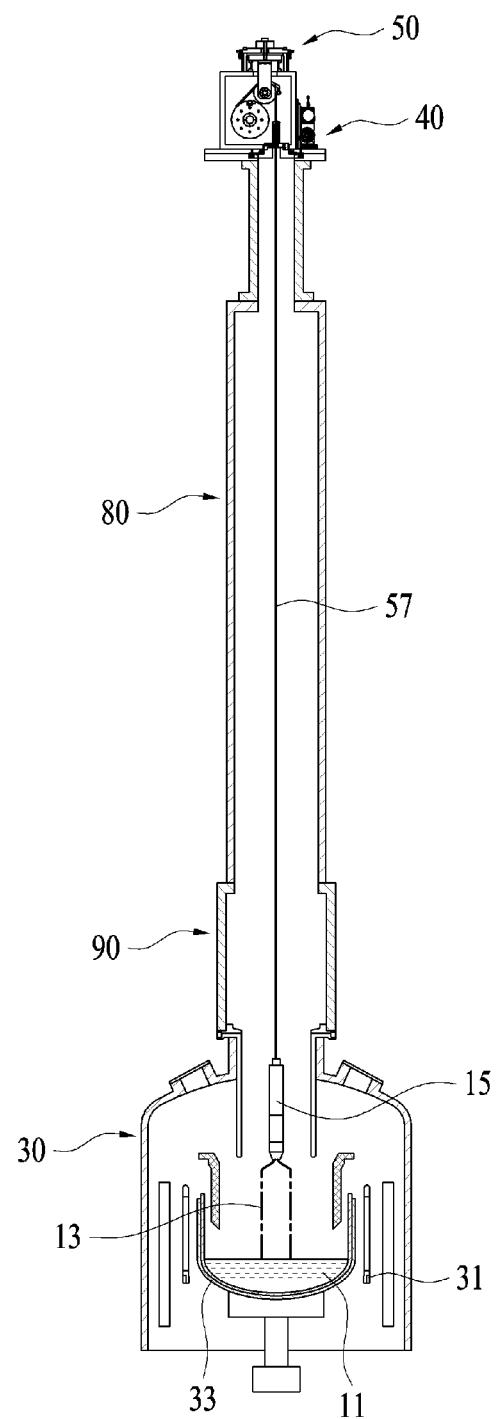
FIG. 2 is a cross-sectional view illustrating a part of the ingot growing apparatus according to the exemplary embodiment of the invention.
Figure 3:
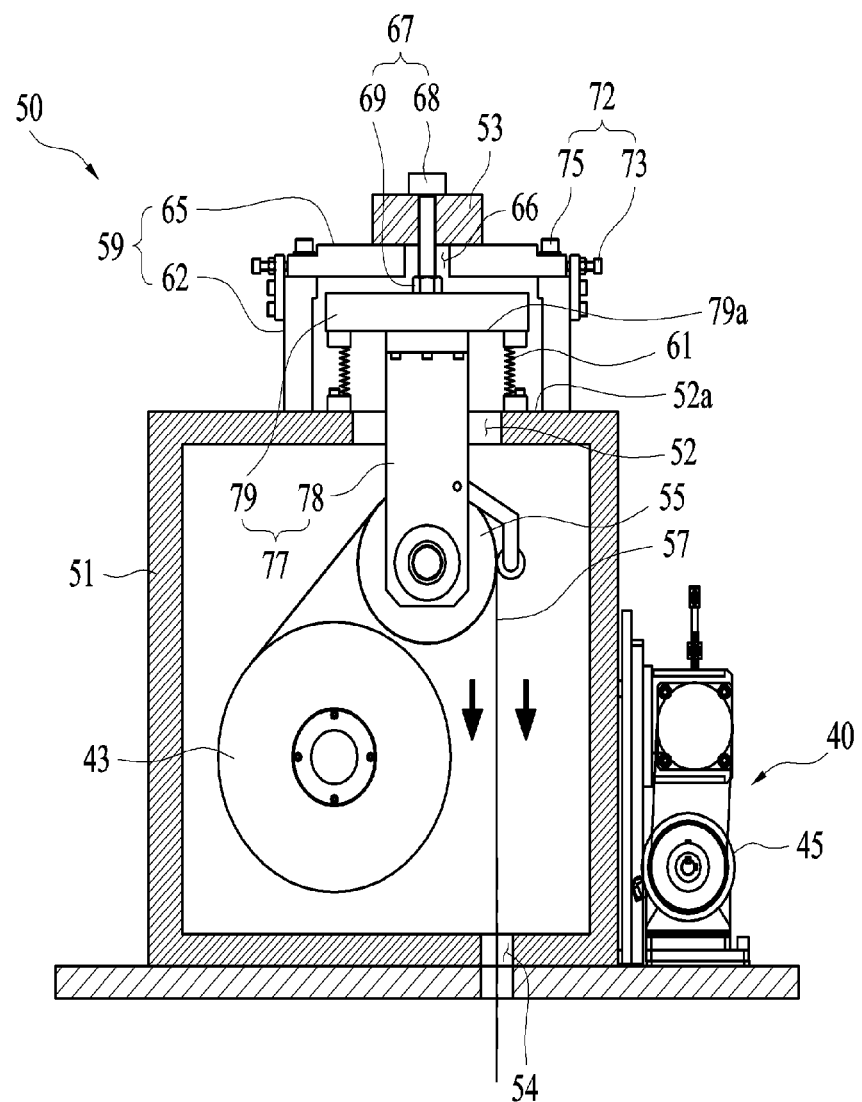
FIG. 3 is a cross-sectional view illustrating a weight-measuring unit and a driving unit of the ingot growing apparatus according to the exemplary embodiment of the invention.

FIG. 1 is a side elevation view illustrating an ingot growing apparatus according to an exemplary embodiment of the invention. FIG. 2 is a cross-sectional view illustrating a part of the ingot growing apparatus according to the exemplary embodiment of the invention. FIG. 3 is a cross-sectional view illustrating a weight-measuring unit and a driving unit of the ingot growing apparatus according to the exemplary embodiment of the invention. Hereinafter, an ingot growing apparatus according to an embodiment of the present invention will be described in greater detail with reference to the accompanying drawings. In the description of the ingot growing apparatus according to the embodiment of the present invention, descriptions will be mainly made of components essential to the principle of the present invention but detailed descriptions of those components not directly related to the principle of the present invention or known components will be omitted.

Referring to FIG. 1, the ingot growing apparatus according to the present embodiment includes a base 20, a main chamber 30, a dome chamber 90, a pull chamber 80, a weight-measuring unit 50, and a driving unit 40.

The base 20 is a component disposed on a bottom surface on which the ingot growing apparatus 10 is placed to support the ingot growing apparatus. The base 20 may be formed as a plurality of frames that are coupled to each other.

Referring to FIG. 1, a main chamber support 32 is disposed on the base 20, and the main chamber 30 is disposed on top of the main chamber support.

The main chamber 30 may have the shape of a cylinder. Referring to FIG. 2, a crucible 33 containing a source material therein and a heater 31 melting the source material by heating the source material may be disposed within the main chamber 30.

The dome chamber 90 is disposed above the crucible 33. The dome chamber 90 may have the shape of a cylinder. A cooling device (not shown) cooling an ingot 13 grown from the crucible 33 may be disposed within the dome chamber 90. The cooling device may be configured such that cooling water circulates within the cooling device.

Referring to FIG. 2, the pull chamber 80 is disposed on top of the dome chamber 90. The pull chamber 80 may have the shape of a cylinder. A growing ingot 13 passes through the interior of the pull chamber 80 while rising via a seed cable 57. That is, the pull chamber functions as a passage through which the ingot can pass.

The weight-measuring unit 50 is disposed on top of the pull chamber 80, and measures the weight of the ingot 13.

Referring to FIG. 3, the weight-measuring unit 50 includes a housing 51, a support roller 55, and a load cell 53. More specifically, the housing 51 is disposed on top of the pull chamber 80, with the interior thereof being maintained in a vacuum state. The housing 51 may have the shape of a cylinder. The housing 51 may have an opening 52. According to the present embodiment, the opening 52 is formed in the upper portion of the housing 51. A drum 43, the support roller 55, and a support roller holder 77 are positioned within the housing 51.

The support roller 55 is disposed within the housing 51, and supports the seed cable 57. The support roller 55 may have the shape of a cylinder. A hole 54 is formed below the support roller 55, and the seed cable 57 moves upwardly and downwardly through the hole 54. The seed cable 57 is wound around the support roller 55, received in the outer circumferential groove of the support roller 55. The seed cable 57 can move downwardly to a position above the melt 11 through the hole 54. The support roller 55 is connected to the support roller holder 77.

The support roller holder 77 includes a first holder section 78 and a second holder section 79. The support roller holder 77 is positioned within and adjacent to the opening 52 of the housing 51 in order to hold the support roller 55. The upper end portion of the support roller holder 77 protrudes outside of the housing 51 through the opening 52 in the upper portion of the housing 51.

Referring to FIG. 3, the first holder section 78 extends through the opening 52 of the housing 51 while supporting the support roller 55. The first holder section 78 has the shape of a cylinder. One end of the first holder section 78 is connected to the support roller 55, and the other end of the first holder section 78 is connected to the second holder section 79.

The second holder section 79 protrudes outwardly from the end of the first holder section 78, for example, in the lateral direction of FIG. 3. The cross-sectional shape of the second holder section 79 in the top-bottom direction may be circular or quadrangular. A surface 79a of the second holder section 79 faces the outer circumferential surface of the opening 52 of the housing 51.

Referring to FIG. 3, a flexible member 61 may be disposed on the support roller holder 77. The flexible member 61 is disposed between the surface 79a of the second holder section 79 and the outer circumferential surface 52a of the opening 52 of the housing 51.

The flexible member 61 provides a seal between the support roller holder 77 and the opening 52 of the housing 51 such that the interior of the housing 51 can be maintained in a vacuum state. As illustrated in FIG. 3, the flexible member 61 is a sealing member that is elastic. The flexible member 61 may be formed as an elastic member.

A support roller-adjusting part 67 includes a third adjustment bolt 68 and an adjustment nut 69. The support roller-adjusting part 67 is connected to the second holder section 79, with at least a portion thereof being disposed on top of the load cell 53. In addition, the second holder section 79 is connected to the support roller 55. It is therefore possible to adjust the height of the support roller 55 by adjusting the height of the second holder section 79.

The third adjustment bolt 68 can extend through a fixing hole 66 formed in the central portion of a fixing plate 65, connecting the load cell 53 to the second holder section 79. Following the rotation of the third adjustment bolt 68, the height of the second holder section 79 is adjusted. Consequently, the height of the support roller 55 is adjusted.

The adjustment nut 69 is connected to one end of the third adjustment bolt 68, and is disposed on the upper central portion of the second holder section 79. The adjustment nut 69 fixes the load cell 53 to the second holder section 79. Consequently, the support roller 55 fixed to the load cell 53 and the second holder section 79 is fixed.

The driving unit 40 includes the drum 43, a driving motor 45, and a speed reducer. The driving unit 40 moves the seed cable 57 supported by the support roller 55.

The drum 43 may have the shape of a cylinder. The drum 43 is disposed in the interior of the housing 51 that is in a vacuum state. One end of the seed cable 57 is wound on the drum 43 to raise the ingot 13. The drum 43 is driven by a driving force applied by the driving motor 45 disposed outside of the housing 51.

The seed cable 57 between the drum 43 and the ingot 13 is supported by the support roller 55. The seed cable 57 is sequentially wound on the drum 43 and the support roller 55, and extends into the dome chamber 90, with the distal end thereof being connected to the ingot 13.

The speed reducer 47 is disposed between the drum 43 and the driving motor 47. The speed reducer 47 adjusts the speed of the ingot 13 caused by the winding of the seed cable 57, such that the rising ingot 13 does not collide with the pull chamber 80, which would otherwise damage the ingot 13.

The seed cable 57 is wound in a plurality of spiral grooves formed in the surface of the drum 43. After being rotated along the circumferential groove of the support roller 55, the seed cable 57 moves downwardly to a position above the melt 11 through the hole 54. A seed 15 and a seed chuck (not shown) are disposed on the distal end of the seed cable 57. This configuration makes it possible to raise the ingot 13 growing on the seed 15. As the ingot 13 grows, the driving motor 45 rotates, rotating the drum 43. Following the rotation of the drum 43, the seed cable 57 is wound on the drum 43, thereby slowly raising the growing ingot 13.

Referring to FIG. 3, the load cell 53 measures the weight of the ingot connected to the distal end of the seed cable 55 by detecting a displacement of the support roller 55. More specifically, the tension of the seed cable 57 proportional to the weight of the ingot 13 acts on the support roller. Consequently, the greater the weight of the ingot 13 is, the greater the extent to which the support roller 55 is displaced upwardly becomes. The load cell 53 detects such displacement, thereby measuring the weight of the ingot 13.

It is possible to precisely measure the weight of the ingot 13 by detecting the weight of the support roller 55, which supports the seed cable 57, using the load cell 53. Processing can be carried out while the weight of the rising ingot 13 is being precisely measured in real time in this manner.

Referring to FIG. 3, in the ingot growing apparatus according to the present invention, a load cell holder 59 is disposed on the outer surface of the housing 51. The load cell holder 59 includes the fixing plate 65 and a plurality of support legs 62.

The fixing plate 65 has a fixing hole 66 in the central portion thereof. The cross-sectional shape of the fixing plate 65 in the top-bottom direction may be circular or quadrangular. The load cell 53 is fixed to the central portion of the fixing plate 65. The plurality of support legs 62 are disposed on both sides of the fixing plate 65.

One end of each of the plurality of support legs 62 is connected to the upper surface of the housing 51, and the other end of each of the plurality of support legs 62 is connected to the fixing plate 65. In this manner, the plurality of support legs 62 support the fixing plate 65 such that the fixing plate 65 is spaced apart from the upper surface of the housing 51. A load cell-adjusting part 72 is disposed on the plurality of support legs 62.

Referring to FIG. 3, the load cell-adjusting part 72 includes first adjustment bolts 73 and second adjustment bolts 75. The load cell-adjusting part 72 is disposed on the load cell holder 59, such that the load cell-adjusting part 72 can adjust the position of the load cell 53.

The first adjustment bolts 73 are disposed on side portions of the fixing plate such that the lateral position of the load cell 53 can be adjusted through the rotation of the first adjustment bolts 73.

The second adjustment bolts 75 are disposed on the plurality of support legs 59 such that the height of the fixing plate 65 can be adjusted through the rotation of the second adjustment bolts 75.

Referring to FIG. 1 to FIG. 3, a supply means 60 serves to supply polycrystalline silicon during the growth of the ingot 13. The supply means 60 is disposed on one side of the main chamber 30. The supply means 60 extends to the crucible 33 through a side portion of the main chamber 30, such that polycrystalline silicon can be supplied to the crucible 33.

When the ingot 13 is raised while being grown in the crucible 33, the weight of the melt 11 within the crucible 33 decreases. The supply means 60 supplies polycrystalline silicon to the crucible 33 by considering decreases in the weight of the melt 11 within the crucible 33.

A decrease in the weight of the melt 11 within the crucible 33 is proportional to an increase in the weight of the ingot 13. Therefore, it is possible to determine decreases in the weight of the melt 11 by measuring increases in the weight of the ingot 13 using the load cell 53. Based on decreases in the weight determined in this manner, the supply means 60 supplies polycrystalline silicon to the crucible 33. That is, the supply means 60 can supply polycrystalline silicon to the crucible 33, corresponding to increases in the weight of the ingot 13 measured by the load cell 53.

According to embodiments of the present invention, the ingot growing apparatus can carry out processing while precisely measuring the weight of the growing ingot using the load cell 53 of the weight-measuring unit 50 disposed outside of the housing 51, which is in a vacuum state. In addition, according to embodiments of the present invention, the housing 51 of the ingot growing apparatus refers to a space in a vacuum in which the processing of the ingot 13 is carried out. Therefore, according to the present invention, to be outside of the housing indicates being positioned in air instead of being in a vacuum state. According to embodiments of the present invention, in the ingot growing apparatus 10, it is relatively easy to dispose, replace, and repair the load cell 53, since the load cell 53 is positioned outside of the housing 51. In addition, it is possible to check the state of the load cell 53 at any time.

Although the exemplary embodiments of the present invention have been described in the specification, the scope of the present invention is not limited thereto. It should be understood that a person skilled in the art can make obviously many modifications and variations by supplementing, altering, omitting, or adding the components without departing from the principle of the invention and such changes shall fall within the scope of the invention.

INDUSTRIAL APPLICABILITY

The ingot growing apparatus according to the embodiment of the present invention can easily and accurately measure the weight of a growing ingot using the load cell and the support roller, thereby increasing the efficiency of the ingot growing process. It is therefore regarded that the present invention has industrial applicability.

The ingot growing apparatus according to the embodiment of the present invention can improve the precision of measurement and easily adjust a track, since the load cell is disposed outside of the housing, which is in a vacuum state. It is therefore regarded that the present invention has industrial applicability.

The invention claimed is:

1. An ingot growing apparatus configured to measure a weight of a growing ingot comprising:
   a main chamber comprising a crucible accommodating a source material therein and a heater melting the source material by heating the crucible;
   a dome chamber disposed on top of the crucible;
   a pull chamber disposed on top of the dome chamber;
   a seed cable by which an ingot grown in the crucible moves within the dome chamber and the pull chamber; and
   a weight-measuring unit disposed on top of the pull chamber,
   wherein the weight-measuring unit comprises:
   a housing disposed on top of the pull chamber, wherein an interior of the housing is maintained in a vacuum state;
   a support roller disposed within the housing to support the seed cable; and
   a load cell disposed outside of the housing to facilitate installation, replacement and repair, wherein the load cell measures a weight of the ingot supported by the support roller;
   a support roller holder positioned within and adjacent to an opening formed in a portion of the housing, wherein one end of the support roller holder is connected to the support roller, and the other end of the support roller holder is connected to the load cell;
   a flexible member providing a seal between the support roller holder and the opening such that an interior of the housing is maintained in a vacuum state; and
   a load cell holder disposed outside of the housing,
   wherein the load cell held by the load cell holder supports the support roller holder;
   wherein the support roller holder comprises a first holder section supporting the support roller, the first holder section extending through the opening, and a second holder section protruding outwardly from one end of the first holder section, a surface of the second holder section facing an outer circumferential surface of the opening, and the flexible member comprises a bellow disposed between the surface of the second support holder facing the outer circumferential surface of the opening and the outer circumferential surface of the opening.

2. The ingot growing apparatus according to claim 1, wherein the opening is disposed in an upper surface of the housing.

3. The ingot growing apparatus according to claim 2, wherein an upper portion of the support roller holder protrudes outside of the housing through the opening.

4. The ingot growing apparatus according to claim 3, wherein the load cell holder comprises a fixing plate to which the load cell is fixed and a plurality of support legs supporting the fixing plate such that the fixing plate is spaced apart from the upper surface of the housing.

5. The ingot growing apparatus according to claim 4, further comprising a load cell-adjusting part disposed on the load cell holder to adjust a position of the load cell, wherein the load cell-adjusting part comprises:
   first adjustment bolts disposed on side portions of the fixing plate to adjust a lateral position of the load cell; and
   second adjustment bolts disposed on the plurality of support legs to adjust a height of the fixing plate.

6. The ingot growing apparatus according to claim 5, further comprising a support roller-adjusting part for adjusting a height of the support roller, at least a portion of the support roller-adjusting part being disposed on top of the load cell, wherein the support roller-adjusting part comprises:
   a third adjustment bolt extending through a fixing hole formed in a central portion of the fixing plate and connecting the load cell to the second holder section, wherein the third adjustment bolt adjusts a height of the support roller connected to the second holder section; and
   an adjustment nut connected to one end of the third adjustment bolt and disposed on the second holder section to fix the load cell to the second holder section.

7. The ingot growing apparatus according to claim 1, further comprising a driving unit moving the seed cable supported by the support roller, wherein the driving unit comprises:
   a drum on which one end of the seed cable is wound;
   a driving motor driving the drum; and
   a speed reducer disposed between the drum and the driving motor.

* * * * *